US012597908B2

(12) United States Patent
Wei et al.

(10) Patent No.: US 12,597,908 B2
(45) Date of Patent: Apr. 7, 2026

(54) BULK ACOUSTIC WAVE RESONATOR, MANUFACTURING METHOD THEREOF AND FILTER

(71) Applicants: Beijing BOE Optoelectronics Technology Co., Ltd., Beijing (CN); BOE Technology Group Co., Ltd., Beijing (CN)

(72) Inventors: Qiuxu Wei, Beijing (CN); Yue Li, Beijing (CN); Lihui Wang, Beijing (CN); Yanfei Ren, Beijing (CN); Taonan Zhang, Beijing (CN); Yuelei Xiao, Beijing (CN); Yifan Wu, Beijing (CN); Yulin Feng, Beijing (CN); Xue Cao, Beijing (CN); Kidong Han, Beijing (CN); Qichang An, Beijing (CN); Wenbo Chang, Beijing (CN); Huiying Li, Beijing (CN); Feng Qu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 134 days.

(21) Appl. No.: 18/580,940

(22) PCT Filed: Aug. 30, 2022

(86) PCT No.: PCT/CN2022/115654
§ 371 (c)(1),
(2) Date: Jan. 19, 2024

(87) PCT Pub. No.: WO2024/044926
PCT Pub. Date: Mar. 7, 2024

(65) Prior Publication Data
US 2025/0105819 A1 Mar. 27, 2025

(51) Int. Cl.
*H03H 9/17* (2006.01)
*H03H 3/02* (2006.01)
(Continued)

(52) U.S. Cl.
CPC .............. *H03H 9/173* (2013.01); *H03H 3/02* (2013.01); *H03H 9/133* (2013.01); *H03H 9/568* (2013.01); *H03H 2003/021* (2013.01)

(58) Field of Classification Search
CPC .......... H03H 9/173; H03H 3/02; H03H 9/133; H03H 9/568; H03H 2003/021; H03H 9/02;
(Continued)

(56) References Cited

U.S. PATENT DOCUMENTS 10,097,156 B2 * 10/2018 Chang .................... H03H 9/132
10,608,608 B2 * 3/2020 Chang .................... H03H 9/173
(Continued)

FOREIGN PATENT DOCUMENTS

CN 1731115 A 2/2006
CN 103326692 A 9/2013
(Continued)

*Primary Examiner* — John W Poos
(74) *Attorney, Agent, or Firm* — Nath, Goldberg & Meyer; Joshua B. Goldberg

(57) ABSTRACT

A bulk acoustic wave resonator, a manufacturing method thereof and a filter are provided and belong to the technical field of radio frequency micro-electro-mechanical system. The resonator includes a dielectric substrate, a first electrode, a piezoelectric layer, and a second electrode. The dielectric substrate has a first cavity penetrating through the dielectric substrate in a thickness direction thereof, and the first cavity includes a first opening penetrating through the first surface, and a second opening penetrating through the second surface. The first opening includes first sides sequentially arranged in a clockwise direction, and first connecting (Continued)

101 sides each connecting two adjacent first sides; the second opening includes second sides sequentially arranged in a clockwise direction, and second connecting sides each connecting two adjacent second sides. The first sides are in one-to-one correspondence with the second sides, and the first connecting sides are in one-to-one correspondence with the second connecting sides.

20 Claims, 9 Drawing Sheets

(51) Int. Cl.
   *H03H 9/13*         (2006.01)
   *H03H 9/56*         (2006.01)
(58) Field of Classification Search
   CPC ........ H03H 9/02157; H03H 9/17; H03H 9/15;
                 H03H 9/54; H03H 2003/023; H03H
                 9/174; H03H 9/171; H03H 9/02015;
                 H03H 9/02118; H03H 2009/155; H03H
                 9/02047; H03H 9/132; H03H 9/46; H03H
                 9/462; H03H 9/547; H03H 9/02102;
                 H03H 9/02133; H03H 9/0523; H03H
                 9/564; H03H 9/0504; H03H 9/131; H03H
                 9/02086; H03H 9/105; H03H 9/13; H03H
                 9/56; H03H 9/1014; H03H 9/58; H03H
                 9/0557; H03H 9/02125; H03H 9/05;
              H03H 9/0542; H03H 9/205; H03H 9/542;
                 H03H 9/02007; H03H 9/0561; H03H
                 9/1007; H03H 9/1035; H03H 9/176;
                 H03H 9/588; H03H 2003/028; H03H
                 9/02228; H03H 9/0514; H03H 9/19;
                 H03H 9/25; H03H 9/545; H03H 9/562;
                 H03H 9/582; H03H 9/587; H03H 9/605;
                 H03H 2003/0442; H03H 3/007; H03H
                 3/0073; H03H 9/0547; H03H 9/172;
                 H03H 9/64; H03H 9/706; H03H 3/04;
                 H03H 9/00; H03H 9/02023; H03H
                 9/0571; H03H 9/1085; H03H 9/703;
                 H03H 19/002; H03H 2003/025; H03H
                 2003/0407; H03H 2009/02173; H03H
                 3/08; H03H 7/175; H03H 9/0211; H03H
                 9/02535; H03H 9/0519; H03H 9/08;
              H03H 9/1042; H03H 9/175; H03H 9/586;
                 H03H 9/70; H03H 2003/0414; H03H
                 2003/0435; H03H 2009/02188; H03H
                 2009/0244; H03H 9/0207; H03H
                 9/02094; H03H 9/02433; H03H 9/589;
                                          H03H 9/6426
         See application file for complete search history.

(56)                References Cited

U.S. PATENT DOCUMENTS

| | | | | |
|---|---|---|---|---|
| 10,886,888 B2 * | 1/2021 | Ivira | .................. | H03H 9/02102 |
| 2003/0193269 A1 | 10/2003 | Jang et al. | | |
| 2013/0147577 A1 * | 6/2013 | Nishihara | ................ | H03H 9/54 |
| | | | | 333/133 |
| 2021/0099156 A1 * | 4/2021 | Kirkendall | ............. | H03H 9/175 |

FOREIGN PATENT DOCUMENTS

| CN | 212012592 U | 11/2020 |
|---|---|---|
| CN | 112039460 A | 12/2020 |
| CN | 113556100 A | 10/2021 |
| CN | 114070244 A | 2/2022 |
| CN | 114094977 A | 2/2022 |
| CN | 114560634 A | 5/2022 |

* cited by examiner

BULK ACOUSTIC WAVE RESONATOR, MANUFACTURING METHOD THEREOF AND FILTER

This is a National Phase Application filed under 35 U.S.C. 371 as a national stage of PCT/CN2022/115654, filed Aug. 30, 2022, the content of which is hereby incorporated by reference in its entirety.

TECHNICAL FIELD

The present disclosure relates to the technical field of radio frequency micro-electro-mechanical system, and in particular to a bulk acoustic wave resonator, a method for manufacturing a bulk acoustic wave resonator and a filter.

BACKGROUND

In the field of mobile communications, the allocated total available frequency is in a narrow range, and there are many frequency bands used for the mobile communication, so that a spacing between adjacent frequency bands is narrow (about several MHz (megahertz) to tens of MHz), and a single frequency band has a narrow bandwidth (tens of MHz). Thus, a filter used in a mobile phone is required to have performance characteristics of a small in-band ripple, a large out-of-band rejection, and a good rectangularity. A conventional micro-strip filter has a large volume, an insufficient out-of-band rejection and a poor rectangularity and cannot meet the above requirement; a cavity filter has a large volume and cannot meet the above requirement; a dielectric filter has a large in-band insertion loss and a poor rectangularity and cannot meet the above requirement; an IPD (Integrated Passive Device) filter has a large in-band ripple and a poor rectangularity and cannot meet the above requirement.

A bulk acoustic wave resonator serves as an elementary unit of a structure of a bulk acoustic wave filter. The existing bulk acoustic wave resonator adopts a silicon wafer as a material of a substrate with a sandwich structure, including a first electrode, a piezoelectric material and a second electrode from bottom to top. An operating principle thereof is: a radio frequency signal enters into the resonator from an electrode at one end of the resonator, then is converted into an acoustic wave signal of mechanical vibration at an interface of the piezoelectric material and the metal electrode through an inverse piezoelectric effect; the acoustic wave signal is formed as a resonant standing wave with a certain frequency in the sandwich structure including the first electrode, the piezoelectric material and the second electrode; a frequency of the radio frequency signal is the same as a resonant frequency of the resonator; the acoustic wave signal is transmitted to the electrode at the other end of the resonator, and is converted into the radio frequency signal at the interface of the metal electrode and the piezoelectric material through a piezoelectric effect. The resonator has a fixed resonant frequency. When the frequency of the radio frequency signal is the same as the resonant frequency of the resonator, the conversion from the radio frequency signal to the acoustic wave signal to the radio frequency signal is high-efficiency; when the frequency of the radio frequency signal is not the same as the resonant frequency of the resonator, the conversion from the radio frequency signal to the acoustic wave signal to the radio frequency signal is low-efficiency, and most of the radio frequency signals cannot be transmitted through the resonator. That is, the resonator functions as a filter, which filters the radio frequency signals.

SUMMARY

The present disclosure aims to solve at least one technical problem in the prior art, and provides a bulk acoustic wave resonator, a method for manufacturing a bulk acoustic wave resonator and a filter.

The embodiment of the present disclosure provides a bulk acoustic wave resonator, including a dielectric substrate, a first electrode, a piezoelectric layer, and a second electrode; wherein the dielectric substrate includes a first surface and a second surface opposite to each other in a thickness direction of the dielectric substrate, the first electrode is on a side of the first surface away from the second surface, the piezoelectric layer is on a side of the first electrode away from the dielectric substrate, and the second electrode is on a side of the piezoelectric layer away from the first electrode; wherein the dielectric substrate has a first cavity penetrating through the dielectric substrate in the thickness direction of the dielectric substrate, and the first cavity includes a first opening penetrating through the first surface, and a second opening penetrating through the second surface; the first opening includes a plurality of first sides sequentially arranged in a clockwise direction, and a plurality of first connecting sides, each of which connects two adjacent first sides; the second opening includes a plurality of second sides sequentially arranged in a clockwise direction, and a plurality of second connecting sides, each of which connects two adjacent second sides; the plurality of first sides are in one-to-one correspondence with the plurality of second sides, and the plurality of first connecting sides are in one-to-one correspondence with the plurality of second connecting sides; for any two adjacent first sides and the first connecting side connecting the two adjacent first sides, a tangent line at any point on one first side intersects with a tangent line at any point on the other first side at a first intersection point, and the first intersection point is on a side of the first connecting side close to the second connecting side corresponding to the first connecting side; and for any two adjacent second sides and the second connecting side connecting the two adjacent second sides, a tangent line at any point on one second side intersects with a tangent line at any point on the other second side at a second intersection point, and the second intersection point is on a side of the second connecting side away from the first connecting side corresponding to the second connecting side.

In some embodiments, the first cavity includes a plurality of first side surfaces sequentially arranged in a clockwise direction and a plurality of first connecting surfaces, each of which connects two adjacent first side surfaces; and an angle between a tangent plane at any point on each first side surface and a plane of the second surface is in a range from 80° to 88°.

In some embodiments, each first connecting surface is an arc surface.

In some embodiments, each first connecting side is an arc segment.

In some embodiments, a curvature radius of each first connecting side is in a range from 5 μm to 50 μm.

In some embodiments, each second connecting side is an arc segment.

In some embodiments, a curvature radius of each first connecting side is in a range from 5 μm to 50 μm.

In some embodiments, each first connecting side is a straight line segment or an arc segment.

In some embodiments, each second connecting side is an arc segment.

In some embodiments, the bulk acoustic wave resonator further includes a supporting layer between the first surface and the first electrode.

The embodiment of the present disclosure provides a method for manufacturing a bulk acoustic wave resonator, wherein the method includes: providing a dielectric substrate, wherein the dielectric substrate includes a first surface and a second surface which are oppositely disposed in a thickness direction of the dielectric substrate; sequentially forming a first electrode, a piezoelectric layer and a second electrode on the first surface of the dielectric substrate; and etching the dielectric substrate to form a first cavity penetrating through the dielectric substrate in the thickness direction of the dielectric substrate; wherein the first cavity includes a first opening penetrating through the first surface, and a second opening penetrating through the second surface; wherein the first opening includes a plurality of first sides sequentially arranged in a clockwise direction, and a plurality of first connecting sides, each of which connects two adjacent first sides; the second opening includes a plurality of second sides sequentially arranged in a clockwise direction, and a plurality of second connecting sides, each of which connects two adjacent second sides; the plurality of first sides are in one-to-one correspondence with the plurality of second sides, and the plurality of first connecting sides are in one-to-one correspondence with the plurality of second connecting sides; for any two adjacent first sides and the first connecting side connecting the two adjacent first sides, a tangent line at any point on one first side intersects with a tangent line at any point on the other first side at a first intersection point, and the first intersection point is on a side of the first connecting side close to the second connecting side corresponding to the first connecting side; and for any two adjacent second sides and the second connecting side connecting the two adjacent second sides, a tangent line at any point on one second side intersects with a tangent line at any point on the other second side at a second intersection point, and the second intersection point is on a side of the second connecting side away from the first connecting side corresponding to the second connecting side.

In some embodiments, the etching the dielectric substrate to form the first cavity penetrating through the dielectric substrate in the thickness direction of the dielectric substrate includes: forming the first cavity penetrating through the dielectric substrate in the thickness direction of the dielectric substrate by performing a laser-induced etching process on the second surface of the dielectric substrate.

In some embodiments, an etching solution used in the laser-induced etching process is hydrofluoric acid or sodium hydroxide.

In some embodiments, the first cavity includes a plurality of first side surfaces sequentially arranged in a clockwise direction and a plurality of first connecting surfaces, each of which connects two adjacent first side surfaces; and an angle between a tangent plane at any point on each first side surface and a plane of the second surface is in a range from 80° to 88°.

In some embodiments, each first connecting surface is an arc surface.

In some embodiments, each first connecting side is an arc segment.

In some embodiments, a curvature radius of each first connecting side is in a range from 5 μm to 50 μm.

In some embodiments, each second connecting side is an arc segment.

In some embodiments, a curvature radius of each first connecting side is in a range from 5 μm to 50 μm.

The embodiment of the present disclosure provides a filter, which includes the bulk acoustic wave resonator in any one of the embodiments.

DETAIL DESCRIPTION OF EMBODIMENTS

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term "comprising", "including", or the like, means that the element or item preceding the term contains the element or item listed after the term and its equivalent, but does not exclude other elements or items. The term "connected", "coupled", or the like is not limited to a physical or mechanical connection, but may include an electrical connection, whether a direct or indirect connection. The terms "upper", "lower", "left", "right", and the like are used only for indicating relative positional relationships, and when the absolute position of an object being described is changed, the relative positional relationships may also be changed accordingly.

Figure 1:
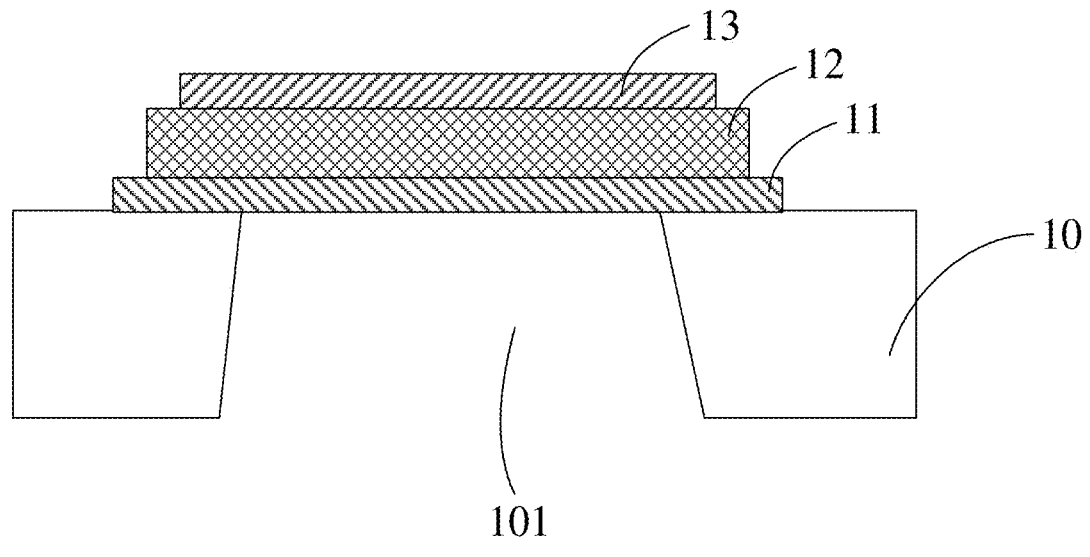
FIG. 1 is a cross-sectional view of an exemplary bulk acoustic wave resonator.
Figure 2:
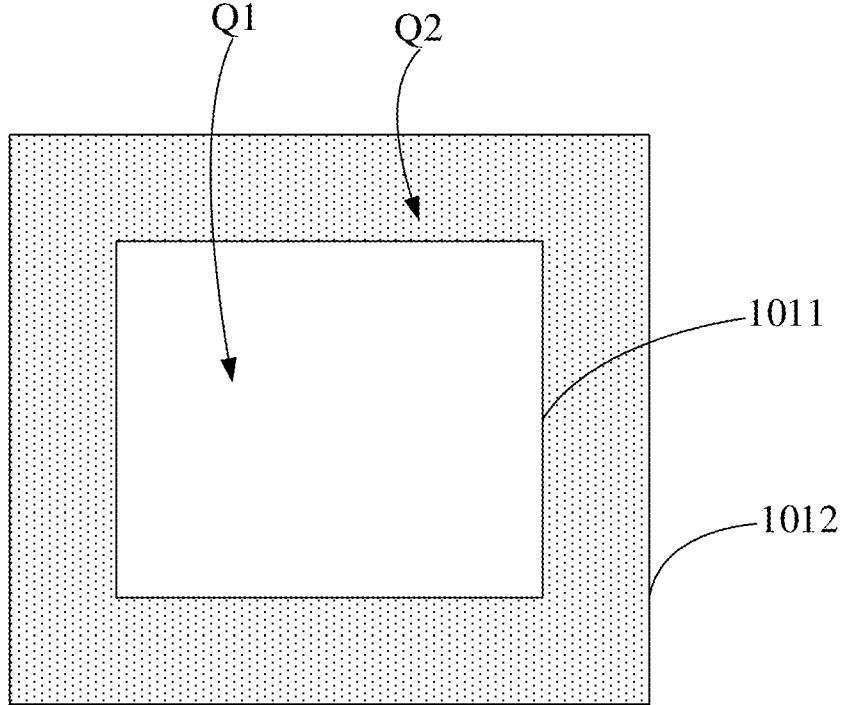
FIG. 2 is a bottom view of a first cavity of the bulk acoustic wave resonator shown in FIG. 1.

FIG. 1 is a cross-sectional view of an exemplary bulk acoustic wave resonator. The bulk acoustic wave resonator is a back-etched bulk acoustic wave resonator (FBAR), as shown in FIG. 1. The bulk acoustic wave resonator includes a dielectric substrate 10, 6 and a first electrode 11, a piezoelectric layer 12, and a second electrode 13 which are sequentially arranged on the dielectric substrate 10. The dielectric substrate 10 has a first cavity 101 penetrating through the dielectric substrate 10 in a thickness direction of the dielectric substrate 10. The dielectric substrate 10 includes a first surface (upper surface) and a second surface (lower surface) which are oppositely disposed in the thickness direction of the dielectric substrate 10; a first opening 1011 of the first cavity 101 penetrates through the first surface, and a second opening 1012 penetrates through the second surface. As shown in FIG. 1, the first electrode 11, the piezoelectric layer 12, and the second electrode 13 are sequentially arranged on the first surface of the dielectric substrate 10. In a method for manufacturing the bulk acoustic wave resonator, the first electrode 11, the piezoelectric layer 12, and the second electrode 13 are usually formed on the first surface of the dielectric substrate 10, and then the first cavity 101 is formed by etching from the second surface of the dielectric substrate 10, so that a size of the first opening 1011 of the first cavity 101 formed at this time is smaller than that of the second opening 1012. FIG. 2 is a bottom view of a first cavity 101 of the bulk acoustic wave resonator shown in FIG. 1. As shown in FIG. 2, it can be seen that the size of the first opening 1011 determines an active region Q1 of the bulk acoustic wave resonator, and a region defined between the first opening 1011 and the second opening 1012 is an inactive region Q2 of the bulk acoustic wave resonator. The technical problem to be solved is how to reduce an area of the inactive region Q2 and achieve the miniaturization of the chip.

For the above problems, the following technical solutions are provided in the embodiments of the present disclosure.

Figure 3:
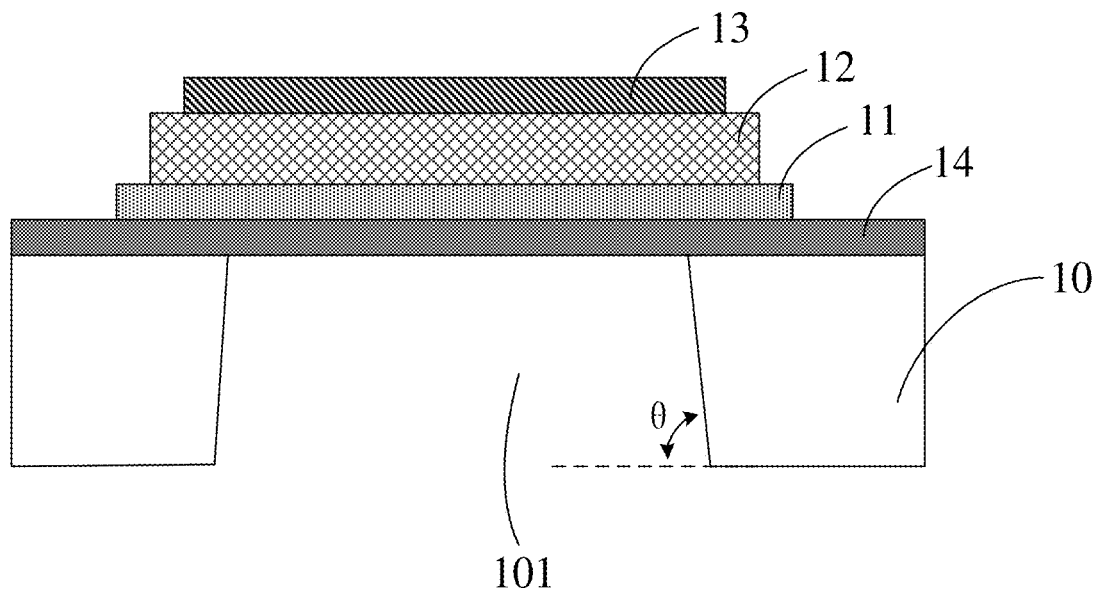
FIG. 3 is a cross-sectional view of a bulk acoustic wave resonator according to an embodiment of the present disclosure.
Figure 4:
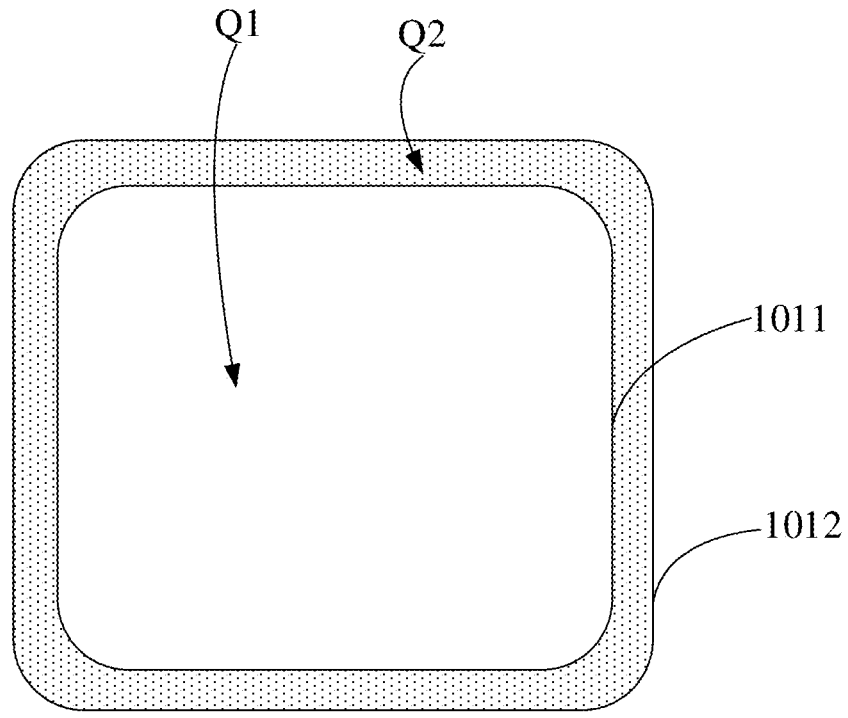
FIG. 4 is a bottom view of a first cavity of the bulk acoustic wave resonator shown in FIG. 3.
Figure 5:
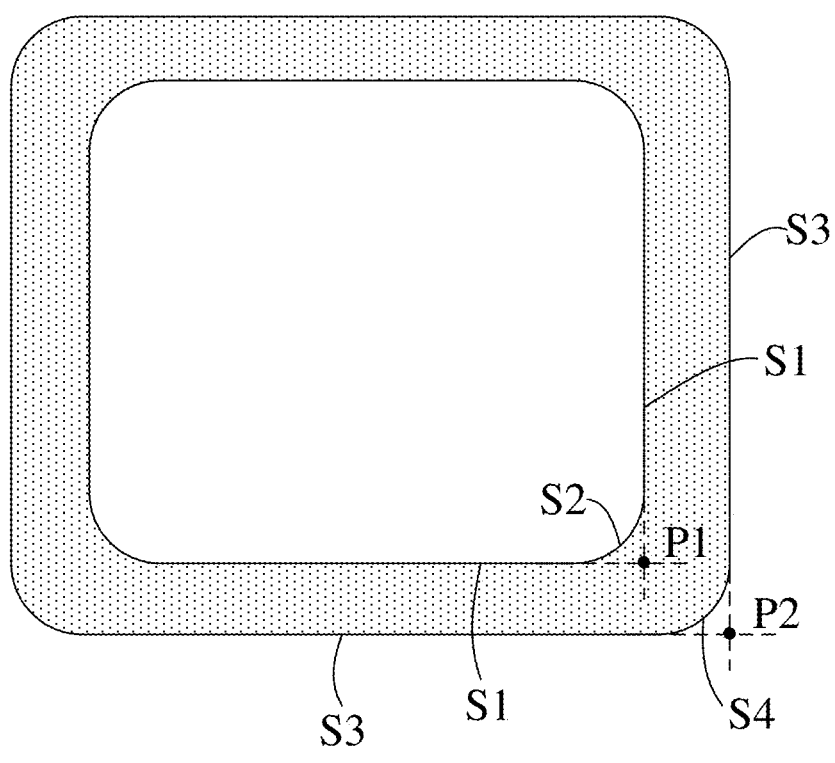
FIG. 5 is a schematic diagram illustrating a correspondence relationship between a first opening and a second opening of a first cavity of a bulk acoustic wave resonator according to an embodiment of the present disclosure.

FIG. 3 is a cross-sectional view of a bulk acoustic wave resonator according to an embodiment of the present disclosure. FIG. 4 is a bottom view of a first cavity 101 of the bulk acoustic wave resonator shown in FIG. 3. FIG. 5 is a schematic diagram illustrating a correspondence relationship between a first opening 1011 and a second opening 1012 of a first cavity 101 of a bulk acoustic wave resonator according to an embodiment of the present disclosure. As shown in FIGS. 3 to 5, the present disclosure provides a bulk acoustic wave resonator, which includes a dielectric substrate 10, and a first electrode 11, a piezoelectric layer 12, and a second electrode 13 which are sequentially arranged on the dielectric substrate 10; and orthographic projections of any two of the first electrode 11, the piezoelectric layer 12 and the second electrode 13 on the dielectric substrate 10 at least partially overlap with each other. The dielectric substrate 10 has a first cavity 101 penetrating through the dielectric substrate 10 in a thickness direction of the dielectric substrate 10. The dielectric substrate 10 includes a first surface (upper surface) and a second surface (lower surface) which are oppositely disposed in the thickness direction of the dielectric substrate 10; the first cavity 101 includes a first opening 1011 formed in the first surface, and a second opening 1012 formed in the second surface. The first electrode 11 is disposed on the first surface, and an orthographic projection of the first electrode 11 on a plane of the second surface (a plane where the second surface is located) covers an orthographic projection of the first opening 1011 on the plane of the second surface.

The first opening 1011 penetrating through the first surface of the dielectric substrate 10 and the second opening 1012 penetrating through the second surface of the dielectric substrate 10 are both polygonal. For example: the first opening 1011 includes a plurality of first sides S1 sequentially arranged in a clockwise (or counterclockwise) direction, and a plurality of first connecting sides S2, each of which connects two adjacent first sides S1 (two first sides S1 adjacent to the first connecting side S2). Accordingly, the second opening 1012 includes a plurality of second sides S3 sequentially arranged in a clockwise (or counterclockwise) direction, and a plurality of second connecting sides S4, each of which connects two adjacent second sides. The first sides S1 are in one-to-one correspondence with the second sides S3, and the first connecting sides S2 are in one-to-one correspondence with the second connecting sides S4.

Further, for two first sides S1 adjacent to each other in the clockwise direction and the first connecting side S2 connecting the two first sides S1, a tangent line at any point on one first side S1 intersects with a tangent line at any point on the other first side S1 at an intersection point which is a first intersection point P1. The first intersection point P1 has a first distance from the first connecting side S2, and is located on a side of the first connecting side S2 close to the second connecting side S4 corresponding to the first connecting side S2.

For two second sides S3 adjacent to each other in the clockwise direction and the second connecting side S4 connecting the two second sides S3, a tangent line at any point on one second side S3 intersects with a tangent line at any point on the other second side S3 at an intersection point which is a second intersection point P2. A second distance exists between the second intersection point P2 and the second connecting side S4, and the second intersection point P2 is located on a side of the second connecting side S4 away from the first connecting side S2 corresponding to the second connecting side S4.

It should be noted that the first sides S1, the second sides S3, the first connecting sides S2 and the second connecting sides S4 may be straight line segments or arc segments. When each first side S1 is a straight line segment, a tangent line at each point on the first side S1 is a straight line, which is an extension line of the first side S1. Similarly, when each second side S3 is a straight line segment, a tangent line at each point on the second side S3 is a straight line, which is an extension line of the second side S3. When each first connecting side S2 is a straight line segment, a flat chamfer is formed between two adjacent first sides S1. When each first connecting sides S2 is an arc segment, a round chamfer is formed between two adjacent first sides S1. Similarly, when each second connecting side S4 is a straight line segment, a flat chamfer is formed between two adjacent second sides S3. When each second connecting side S4 is an arc line segment, a round chamfer is formed between two adjacent second sides S3.

In the embodiment of the present disclosure, every two adjacent first sides S1 of the first opening 1011 are connected by the corresponding first connecting side S2, and every two adjacent second sides S3 of the second opening 1012 are connected by the corresponding second connecting side S4, and the intersection point where a tangent line at any point on one of the two adjacent first sides S1 and a tangent line at any point on the other first side S1 intersect with each other. That is, the first intersection point P1, is located on a side of the first connecting side S2 connecting the two first sides S1 close to the second connecting side S4 corresponding to the first connecting side S2, and the intersection point where a tangent line at any point on one of the two adjacent second sides S3 and a tangent line at any point on the other second side S3 intersect with each other, that is, the second intersection point P2, is located on a side of the second connecting side S4 connecting the two second sides S3 away from the first connecting side S2 corresponding to the second connecting side. As shown in FIG. 4, it is obvious that an area of the inactive region Q2 of the bulk acoustic wave resonator in the embodiment of the present disclosure is reduced compared with the area of the inactive region Q2 of the bulk acoustic wave resonator shown in FIG. 2, so that the chip size can be effectively reduced. When a plurality of bulk acoustic wave resonators electrically connected together are applied to a filter, the area of the inactive region Q2 of each bulk acoustic wave resonator is reduced, and an area of the active region Q1 is correspondingly increased, so that a length of routing wires of the bulk acoustic wave resonators electrically connected together can be shortened, and the signal transmission loss can be reduced.

In some examples, the first cavity 101 in the dielectric substrate 10 includes a plurality of first side surfaces sequentially arranged in the clockwise (or counterclockwise) direction, and a plurality of first connecting surfaces, each of which connects two adjacent first side surfaces. Each first side surface includes one first side S1 of the first opening 1011 and one second side S3 of the second opening 1012. Each first connecting surface includes one first connecting side S2 of the first opening 1011 and one second connecting side S4 of the second opening 1012.

When each first side surface is a flat surface, each first side S1 of the first opening 1011 and each second side S3 of the second opening 1012 are both straight line segments. When each first side surface is an arc surface, each first side S1 of the first opening 1011 and each second side S3 of the second opening 1012 are both arc segments. When each first connecting surface is a flat surface, each first connecting side S2 of the first opening 1011 and each second connecting side S4 of the second opening 1012 are both straight line segments, in which case, a flat chamfer is formed between every two adjacent first sides S1 of the first opening 1011, and similarly, a flat chamfer is formed between every two adjacent second sides S3 of the second opening 1012. When each first connecting surface is an arc surface, each first connecting side S2 of the first opening 1011 and each second connecting side S4 of the second opening 1012 are arc segments, in which case, a rounded chamfer is formed between every two adjacent first sides S1 of the first opening 1011, and similarly, a rounded chamfer is formed between every two adjacent second sides S3 of the second opening 1012.

Furthermore, an angle $\theta$ between a tangent plane at any point on each first side surface of the first cavity 101 and a plane of the second surface is in a range from 80° to 88°. The angle depends on process parameters for etching the dielectric substrate 10.

The dielectric substrate 10 may be a glass substrate in the embodiment of the present disclosure. The first cavity 101 in the dielectric substrate 10 may be formed by a laser etching process. For example: after the first electrode 11, the piezoelectric layer 12 and the second electrode 13 are formed on the first surface of the dielectric substrate 10, the second surface of the dielectric substrate may be modified by laser, and Si—O molecular bonds in the glass substrate are destroyed, so that an etching rate at the modified position during wet etching is far higher than that at an unmodified position. Then, the modified position is corroded by hydrofluoric acid at the normal temperature, and the angle $\theta$ between the tangent plane at any point on each first side surface of the formed first cavity 101 and the plane of the second surface is in a range from about 80° to 85°. For another example: after the first electrode 11, the piezoelectric layer 12 and the second electrode 13 are formed on the first surface of the dielectric substrate 10, the second surface of the dielectric substrate may be modified by laser, and Si—O molecular bonds in the glass substrate are destroyed, so that an etching rate at the modified position during wet etching is far higher than that at an unmodified position. Then, the modified position is corroded by sodium hydroxide at a high temperature in a range from 100° C. to 120° C., and the angle $\theta$ between the tangent plane at any point on each first side surface of the formed first cavity 101 and the plane of the second surface is in a range from about 85° to 88°.

In the embodiment of the present disclosure, if each first side surface is a flat surface, the tangent plane at the first side surface is an extension plane of the first side surface itself.

In some examples, each first connecting side S2 of the first opening 1011 of the first cavity 101 may be an arc segment, i.e., a rounded chamfer is formed between every two adjacent first sides S1. Similarly, each second connecting side S4 of the second opening 1012 of the first cavity 101 may be an arc segment, i.e., a rounded chamfer is formed between every two adjacent second sides S3.

Furthermore, the first connecting side S2 and the second connecting side S4 are correspondingly arranged, the first connecting side S2 and the second connecting side S4 each are an arc segment, and has a curvature radius which is in a range from 5 μm to 50 μm.

Figure 6:
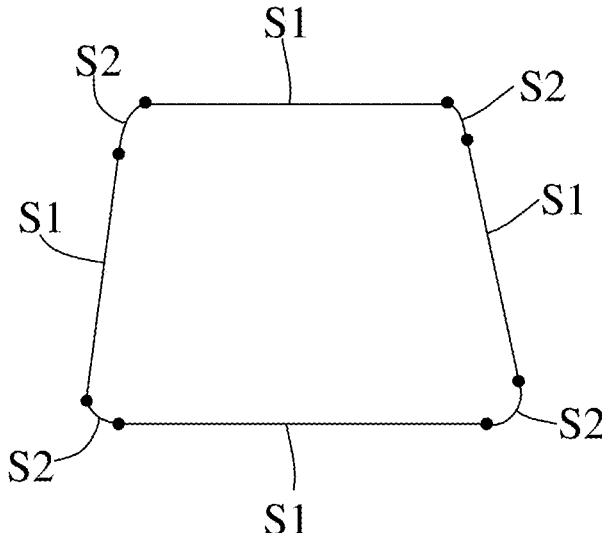
FIG. 6 is a schematic diagram of a first opening of a first cavity of a bulk acoustic wave resonator according to an embodiment of the present disclosure.
Figure 7:
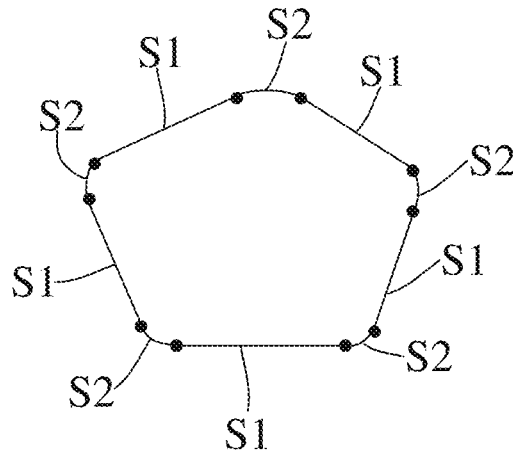
FIG. 7 is a schematic diagram of a first opening of a first cavity of a bulk acoustic wave resonator according to an embodiment of the present disclosure.

In some examples, FIG. 6 is a schematic diagram of a first opening 1011 of a first cavity 101 of a bulk acoustic wave resonator according to an embodiment of the present disclosure. As shown in FIG. 6, when each first side S1 of the first opening 1011 of the first cavity 101 is a straight line segment, the number of the first sides S1 may be four, and correspondingly, the number of the first connecting sides S2 is also four. If the first connecting sides S2 are arc segments, a shape of the first opening 1011 is a quadrangle with four round chamfers; if the first connecting sides S2 are straight line segments, the shape of the first opening 1011 is a quadrangle with four flat chamfers. FIG. 7 is a schematic diagram of a first opening 1011 of another first cavity 101 of a bulk acoustic wave resonator according to an embodiment of the present disclosure. As shown in FIG. 7, when each first side S1 of the first opening 1011 of the first cavity 101 is a straight line segment, the number of the first sides S1 may be five, and correspondingly, the number of the first connecting sides S2 is also five. If each first connecting side S2 is an arc segment, the shape of the first opening 1011 is a pentagon with five rounded chamfers; if each first connecting side S2 is a straight line segment, the shape of the first opening 1011 is a pentagon with five flat chamfers. It should be noted that only the number of the first sides S1 and the number of the first connecting sides S2 are four or five as an example in the above description, and the number of the first sides S1 and the number of the first connecting sides S2 are not limited in the embodiment of the present disclosure.

Figure 8:
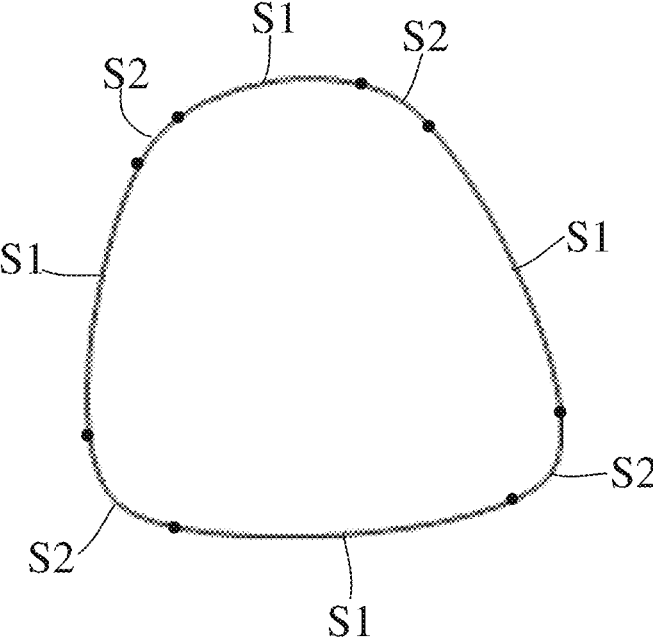
FIG. 8 is a schematic diagram of a first opening of a first cavity of a bulk acoustic wave resonator according to an embodiment of the present disclosure.

FIG. 8 is a schematic diagram of a first opening 1011 of yet another first cavity 101 of a bulk acoustic wave resonator according to an embodiment of the present disclosure. As shown in FIG. 8, when each first side S1 of the first opening 1011 of the first cavity 101 is an arc segment, and each first connecting side S2 is also an arc segment, the shape of the first opening 1011 is arc-shaped. Alternatively, when each first side S1 is an arc segment, each first connecting side S2 may be a straight line segment.

The first sides S1 of the first opening 1011 of the first cavity 101 and the first sides S1 of the second opening 1012 are in one-to-one correspondence with each other, and the first connecting sides S2 and the second connecting sides S4 correspond to each other in the embodiment of the present disclosure, so that a shape of the second opening 1012 is the same as that of the first opening 1011. For example: when the shape of the first opening 1011 is a quadrangle having four rounded chamfers; the shape of the second opening 1012 is also a quadrangle having four rounded chamfers; when the shape of the first opening 1011 is arc-shaped, the shape of the second opening 1012 is also arc-shaped.

In some examples, with continued reference to FIG. 3, the bulk acoustic wave resonator according to embodiments of the present disclosure may include not only the above structure, but also a supporting layer 14. The supporting layer 14 is used to provide a supporting function for the first electrode 11, which can improve the mechanical strength of the resonator and reduce the risk of cracking. The supporting layer 14 may be made of an insulating material selected from $SiO_2$, $Si_3N_4$, $Al_2O_3$, and a stack thereof. In some examples, the supporting layer has a thickness in a range from about 100 nm to 300 nm.

In some examples, a material of the dielectric substrate 10 is preferably glass, and the dielectric substrate 10 made of glass has low dielectric loss and high resistivity characteristics, which helps to improve the insertion loss performance of the filter. Alternatively, the dielectric substrate 10 may be made of Si, sapphire, SiC, GaAs, GaN, InP, BN, ZnO, etc., and a thickness of the dielectric substrate 10 is in a range from 50 μm to 500 μm.

In some examples, a material of the first electrode 11 is preferably Cu, Al, Mo, Co, Ag, Ti, Pt, Ru, W, Au, or an alloy material formed of these metals. A thickness of the first electrode 11 is in a range from 200 nm to 600 nm.

In some examples, a material of the second electrode 13 may be selected from Cu, Al, Mo, Co, Ag, Ti, Pt, Ru, W, Au, or an alloy material formed of these metals. A thickness of the second electrode 13 is in a range from 200 nm to 600 nm.

In some examples, the material of the piezoelectric layer 12 may be selected from AlN, ZnO, PZT, GaN, InN, CdS, CdSe, ZnS, CdTe, ZnTe, GaAs, GaSb, InAs, InSb, GaSe, GaP, AlP, quartz crystal, $LiTaO_3$, $LiNbO_3$, $La_3Ga_5SiO_{14}$, $BaTiO_3$, $PbNb_2O_6$, PBLN, $LiGaO_3$, $LiGeO_3$, $TiGeO_3$, $PbTiO_3$, $PbZrO_3$, PVDF, etc. The piezoelectric layer 12 in the present embodiment may be one of the piezoelectric materials described above, or may be a stack of the above piezoelectric materials. A thickness of the piezoelectric layer 12 is in a range of 10 nm to 100 μm.

The embodiment of the present disclosure provides a method for manufacturing a bulk acoustic wave resonator, which may be used for forming the bulk acoustic wave resonator. The method for manufacturing the bulk acoustic wave resonator according to the embodiment of the present disclosure may include the following steps: providing a dielectric substrate 10, wherein the dielectric substrate 10 includes a first surface and a second surface which are oppositely disposed in the thickness direction of the dielectric substrate 10; sequentially forming a first electrode 11, a piezoelectric layer 12 and a second electrode 13 on the first surface of the dielectric substrate 10; etching the dielectric substrate 10 to form a first cavity 101 penetrating through the dielectric substrate 10 in the thickness direction of the dielectric substrate 10; the first opening 1011 of the first cavity 101 penetrates through the first surface, and the second opening 1012 penetrates through the second surface.

In the embodiment of the present disclosure, the first opening 1011 and the second opening 1012 of the formed first cavity 101 are both polygonal. For example: the first opening 1011 includes a plurality of first sides S1 sequentially arranged in a clockwise (or counterclockwise) direction, and a plurality of first connecting sides S2, each of which connects two adjacent first sides S1. Accordingly, the second opening 1012 includes a plurality of second sides S3 sequentially arranged in a clockwise (or counterclockwise) direction, and a plurality of second connecting sides S4, each of which connects two adjacent second sides. The first sides S1 are in one-to-one correspondence with the second sides S3, and the first connecting sides S2 are in one-to-one correspondence with the second connecting sides S4.

Further, for two first sides S1 adjacent to each other in the clockwise direction and the first connecting side S2 connecting the two first sides S1, a tangent line at any point on one first side S1 intersects with a tangent line at any point on the other first side S1 at an intersection point which is a first intersection point P1. The first intersection point P1 has a first distance from the first connecting side S2, and is located on a side of the first connecting side S2 close to the second connecting side S4 corresponding to the first connecting side S2.

For two second sides S3 adjacent to each other in the clockwise direction and the second connecting side S4 connecting the two second sides S3, a tangent line at any point on one second side S3 intersects with a tangent line at any point on the other second side S3 at an intersection point which is a second intersection point P2. A second distance exists between the second intersection point P2 and the second connecting side S4, and the second intersection point P2 is located on a side of the second connecting side S4 away from the first connecting side S2 corresponding to the second connecting side S4.

In the embodiment of the present disclosure, every two adjacent first sides S1 of the first opening 1011 are connected by the corresponding first connecting side S2, and every two adjacent second sides S3 of the second opening 1012 are connected by the corresponding second connecting side S4, and the intersection point where a tangent line at any point on one of the two adjacent first sides S1 and a tangent line at any point on the other first side S1 intersect with each other, that is, the first intersection point P1, is located on a side of the first connecting side S2 connecting the two first sides S1 close to the second connecting side S4 corresponding to the first connecting side S2, and the intersection point where a tangent line at any point on one of the two adjacent second sides S3 and a tangent line at any point on the other second side S3 intersect with each other, that is, the second intersection point P2, is located on a side of the second connecting side S4 connecting the two second sides S3 away from the first connecting side S2 corresponding to the second connecting side. As shown in FIG. 4, it is obvious that an area of the inactive region Q2 of the bulk acoustic wave resonator in the embodiment of the present disclosure is reduced compared with the area of the inactive region Q2 of the bulk acoustic wave resonator shown in FIG. 2, so that the chip size can be effectively reduced. When a plurality of bulk acoustic wave resonators electrically connected together are applied to a filter, the area of the inactive region Q2 of each bulk acoustic wave resonator is reduced, so that a length of routing wires of the bulk acoustic wave resonators electrically connected together can be shortened, and the signal transmission loss can be reduced.

Figure 9:
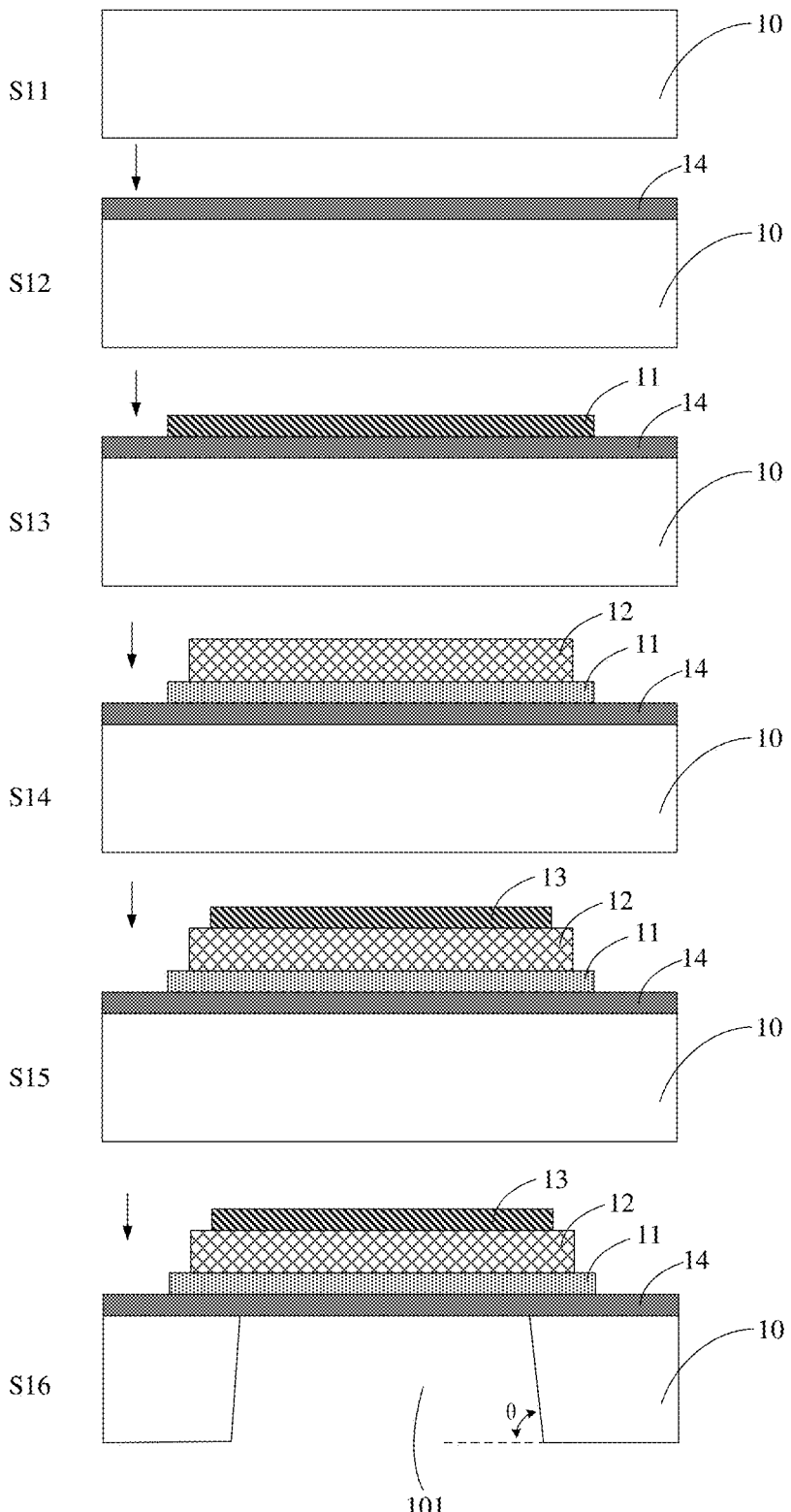
FIG. 9 is a flowchart of a method for manufacturing a bulk acoustic wave resonator according to an embodiment of the present disclosure.

A method for manufacturing a bulk acoustic wave resonator in the embodiment of the present disclosure will be described below with reference to a specific example. FIG. 9 is a flowchart of a method for manufacturing a bulk acoustic wave resonator according to an embodiment of the present disclosure. As shown in FIG. 9, the method of the embodiment of the present disclosure may specifically include the following steps S11 to S16.

In the step S11, a dielectric substrate 10 is provided; wherein the dielectric substrate 10 includes a first surface and a second surface which are oppositely disposed in the thickness direction of the dielectric substrate 10.

In this step, the dielectric substrate 10 may be cleaned and then dried by air knife.

In the step S12, a supporting layer 14 is formed on the first surface of the dielectric substrate 10.

In some examples, the step S12 may include depositing an electrically insulating material on the first surface of the dielectric substrate 10, optionally by radio frequency magnetron sputtering, pulsed laser sputtering (PLD), atomic layer deposition (ALD), plasma chemical vapor deposition (PECVD), followed by coating photoresist (or spraying photoresist), pre-baking, exposing, developing, post-baking, and etching to form the supporting layer 14.

In the step S13, a pattern including the first electrode 11 is formed on a side of the supporting layer 14 away from the dielectric substrate 10.

In some examples, the step S13 may include depositing a first conductive film on the supporting layer 14 away from the dielectric substrate 10, preferably by direct current magnetron sputtering (alternatively, radio frequency magnetron sputtering), alternatively by pulsed laser sputtering (PLD), molecular beam epitaxy (MBE), thermal evaporation, electron beam evaporation. Processes including coating photoresist (or spraying photoresist), pre-baking, exposing, developing and post-baking are performed on the first conductive film. Finally, an etching process is performed, preferably a wet etching process, or alternatively a dry etching process, to form a pattern including the first electrode 11.

In the step S14, a pattern including the piezoelectric layer 12 is formed on a side of the first electrode 11 away from the supporting layer 14.

In some examples, the step S14 may include depositing a piezoelectric material layer on a side of the first electrode 11 away from the supporting layer 14, and the depositing method may include radio frequency magnetron sputtering, pulsed laser sputtering (PLD), molecular beam epitaxy (MBE), metal organic chemical vapor deposition (MOCVD), plasma enhanced chemical vapor deposition (PECVD)), or the like. The piezoelectric material layer is subjected to a photolithography process including coating photoresist (or spraying photoresist), pre-baking, exposing, developing and post-baking. Finally, the piezoelectric material layer is etched to form a pattern of the piezoelectric layer 12.

In the step S15, a pattern including the second electrode 13 is formed on a side of the piezoelectric layer 12 away from the first electrode 11.

In some examples, the step S15 may include depositing a second conductive film on a side of the piezoelectric layer 12 away from the first electrode 11, preferably by direct current magnetron sputtering (alternatively, radio frequency magnetron sputtering), alternatively by pulsed laser sputtering (PLD), molecular beam epitaxy (MBE), thermal evaporation, electron beam evaporation. Processes including coating photoresist (or spraying photoresist), pre-baking, exposing, developing and post-baking are performed on the second conductive film. Finally, an etching process is performed, to form the second electrode 13.

In the step S16, the dielectric substrate 10 is turned over after the steps are completed, and an etching process is performed from the second surface side to form the first cavity 101. The first opening 1011 of the first cavity 101 penetrates through the first surface, and the second opening 1012 penetrates through the second surface.

The first opening 1011 includes a plurality of first sides S1 sequentially arranged in a clockwise (or counterclockwise) direction, and a plurality of first connecting sides S2, each of which connects two adjacent first sides S1. Accordingly, the second opening 1012 includes a plurality of second sides S3 sequentially arranged in a clockwise (or counterclockwise) direction, and a plurality of second connecting sides S4, each of which connects two adjacent second sides. The first sides S1 are in one-to-one correspondence with the second sides S3, and the first connecting sides S2 are in one-to-one correspondence with the second connecting sides S4.

Further, for two first sides S1 adjacent to each other in the clockwise direction and the first connecting side S2 connecting the two first sides S1, a tangent line at any point on one first side S1 intersects with a tangent line at any point on the other first side S1 at an intersection point which is a first intersection point P1. The first intersection point P1 has a first distance from the first connecting side S2, and is located on a side of the first connecting side S2 close to the second connecting side S4 corresponding to the first connecting side S2.

For two second sides S3 adjacent to each other in the clockwise direction and the second connecting side S4 connecting the two second sides S3, a tangent line at any point on one second side S3 intersects with a tangent line at any point on the other second side S3 at an intersection point which is a second intersection point P2. A second distance exists between the second intersection point P2 and the second connecting side S4, and the second intersection point P2 is located on a side of the second connecting side S4 away from the first connecting side S2 corresponding to the second connecting side S4.

In some examples, the dielectric substrate 10 is etched to form the first cavity 101 in step S16, and the first cavity 101 may be formed by a laser etching process. The glass is etched by performing a laser-induced etching process to form etched rounded chamfers, so that stress is prevented from concentrating, the mechanical reliability of the device is improved, and the mass production of the device is facilitated.

In one example, the dielectric substrate 10 may be a glass substrate. In this step, the dielectric substrate 10 is bombarded by laser, so that the bombarded region of the dielectric substrate 10 is modified, and Si—O molecular bonds in the glass substrate are destroyed, and thus, an etching rate at the modified position during wet etching is far higher than that at an unmodified position. Then, the modified position is corroded by hydrofluoric acid at the normal temperature, to form the first cavity 101. The angle θ between the tangent plane at any point on each first side surface of the formed first cavity 101 and the plane of the second surface is in a range from about 80° to 85°.

In another example, the dielectric substrate 10 may be a glass substrate. In this step, the dielectric substrate 10 is bombarded by laser, so that the bombarded region of the dielectric substrate 10 is modified, and Si—O molecular bonds in the glass substrate are destroyed, and thus, an etching rate at the modified position during wet etching is far higher than that at an unmodified position. Then, the modified position is corroded by sodium hydroxide at a high temperature in a range from 100° C. to 120° C., to form the first cavity 101. The angle θ between the tangent plane at any point on each first side surface of the formed first cavity 101 and the plane of the second surface is in a range from about 85° to 88°.

The embodiment of the present disclosure provides a filter, which includes the resonator in any one of the embodiments, which will be described below with reference to specific examples.

Figure 10:
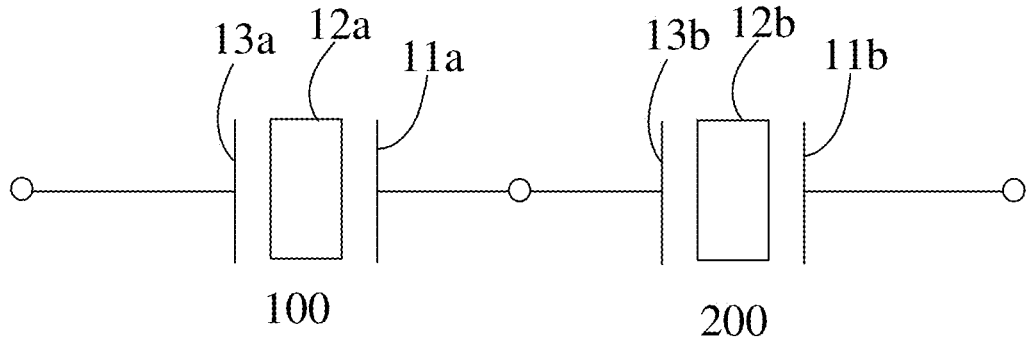
FIG. 10 is a circuit diagram of a filter in a first example of an embodiment of the present disclosure.
Figure 11:
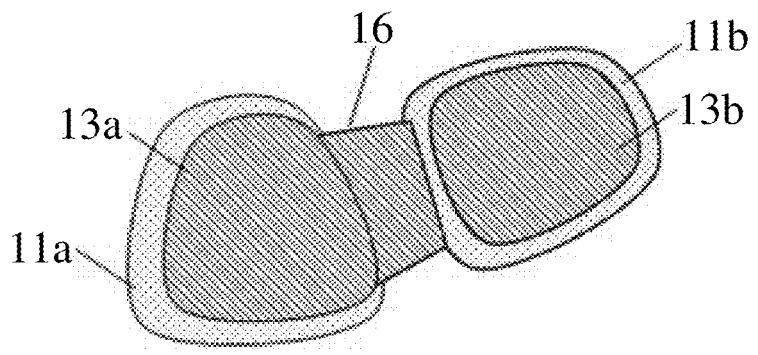
FIG. 11 is a top view of the filter shown in FIG. 10.
Figure 12:
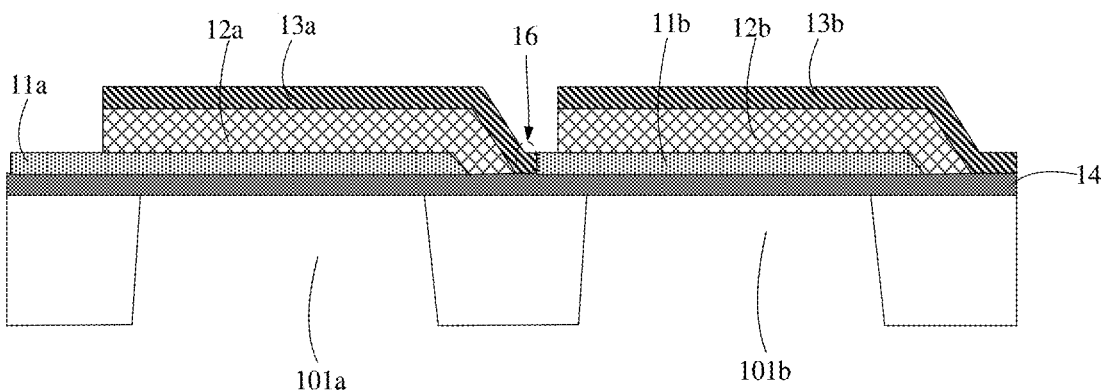
FIG. 12 is a cross-sectional view of the filter shown in FIG. 10.

In a first example, FIG. 10 is a circuit diagram of a filter in a first example of an embodiment of the present disclosure. FIG. 11 is a top view of the filter shown in FIG. 10. FIG. 12 is a cross-sectional view of the filter shown in FIG. 10. As shown in FIGS. 10 to 12, the filter includes a plurality of resonators connected in series. As an example, the filter includes two resonators connected in series. For convenience of description, the two resonators are referred to as a first resonator 100 and a second resonator 200, respectively. The dielectric substrate 10 of the first resonator 100 and the dielectric substrate 10 of the second resonator 200 are common. The second electrode 13a of the first resonator 100 is electrically connected to the first electrode 11b of the second resonator 200 through a first trace 16, thereby realizing the series connection of the first resonator 100 and the second resonator 200.

For the specific structure of layers of the filter shown in FIG. 10, as shown in FIG. 12, the dielectric substrate 10 has a first cavity 101a of the first resonator 100 and a first cavity 101b of the second resonator 200, the supporting layer 14 is disposed on the first surface of the dielectric substrate 10, a first electrode 11a of the first resonator 100 and a first electrode 11b of the second resonator 200 are disposed on a side of the supporting layer 14 away from the first surface, the first electrode 11a of the first resonator 100 and the first electrode 11b of the second resonator 200 are disposed in the same layer, and the first electrode 11a of the first resonator 100 covers the first opening of the first cavity 101a of the first resonator 100, and the first electrode 11b of the second resonator 200 covers the first opening of the first cavity 101b of the second resonator 200; a piezoelectric layer 12a of the first resonator 100 is located on a side of the first electrode 11a of the first resonator 100 away from the supporting layer 14, a piezoelectric layer 12b of the second resonator 200 is located on a side of the first electrode 11b of the second resonator 200 away from the supporting layer 14, and the piezoelectric layer 12a of the first resonator 100 and the piezoelectric layer 12b of the second resonator 200 are arranged in the same layer; the second electrode 13a of the first resonator 100 is located on a side of the piezoelectric layer 12a of the first resonator 100 away from the first electrode 11a, the second electrode 13b of the second resonator 200 is located on a side of the piezoelectric layer 12b of the second resonator 200 away from the first electrode 11b, the second electrode 13a of the first resonator 100 is electrically connected to the first electrode 11b of the second resonator 200 through the first trace 16, and the second electrode 13a of the first resonator 100 and the first trace 16 have a one-piece structure and may be disposed in the same layer as the second electrode 13b of the second resonator 200.

Figure 13:
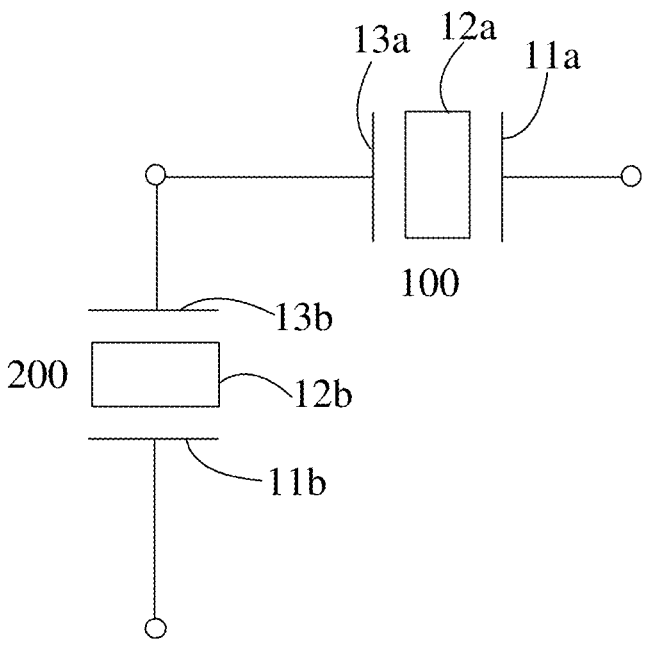
FIG. 13 is a circuit diagram of a filter in a second example of an embodiment of the present disclosure.
Figure 14:
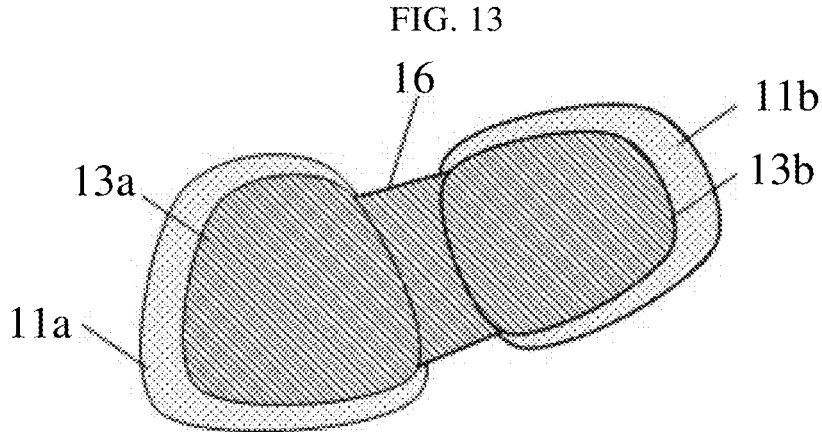
FIG. 14 is a top view of the filter shown in FIG. 13.
Figure 15:
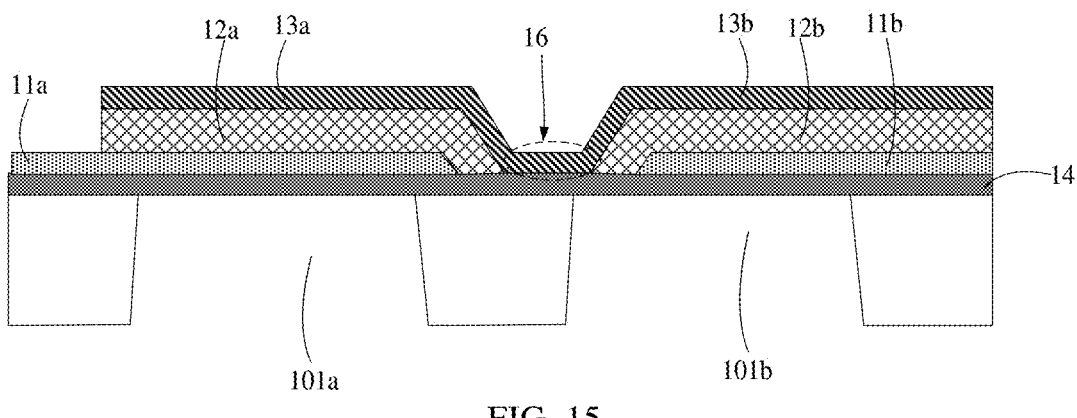
FIG. 15 is a cross-sectional view of the filter shown in FIG. 13.

In a second example, FIG. 13 is a circuit diagram of a filter in a second example of an embodiment of the present disclosure. FIG. 14 is a top view of the filter shown in FIG. 13. FIG. 15 is a cross-sectional view of the filter shown in FIG. 13. As shown in FIGS. 13 to 15, the filter includes a plurality of resonators connected in parallel. As an example, the filter includes two resonators connected in parallel. For convenience of description, the two resonators are referred to as a first resonator 100 and a second resonator 200, respectively. The dielectric substrate 10 of the first resonator 100 and the dielectric substrate 10 of the second resonator 200 are common. The second electrode 13a of the first resonator 100 is electrically connected to the second electrode 13b of the second resonator 200 through a first trace 16, thereby realizing the parallel connection of the first resonator 100 and the second resonator 200.

For the specific structure of layers of the filter shown in FIG. 13, as shown in FIG. 15, the dielectric substrate 10 has a first cavity 101a of the first resonator 100 and a first cavity 101b of the second resonator 200, the supporting layer 14 is disposed on the first surface of the dielectric substrate 10, a first electrode 11a of the first resonator 100 and a first electrode 11b of the second resonator 200 are disposed on a side of the supporting layer 14 away from the first surface, the first electrode 11a of the first resonator 100 and the first electrode 11b of the second resonator 200 are disposed in the same layer, and the first electrode 11a of the first resonator 100 covers the first opening of the first cavity 101a of the first resonator 100, and the first electrode 11b of the second resonator 200 covers the first opening of the first cavity 101b of the second resonator 200; a piezoelectric layer 12a of the first resonator 100 is located on a side of the first electrode 11a of the first resonator 100 away from the supporting layer 14, a piezoelectric layer 12b of the second resonator 200 is located on a side of the first electrode 11b of the second resonator 200 away from the supporting layer 14, and the piezoelectric layer 12a of the first resonator 100 and the piezoelectric layer 12b of the second resonator 200 are arranged in the same layer; the second electrode 13a of the first resonator 100 is located on a side of the piezoelectric layer 12a of the first resonator 100 away from the first electrode 11a, the second electrode 13b of the second resonator 200 is located on a side of the piezoelectric layer 12b of the second resonator 200 away from the first electrode 11b, the second electrode 13a of the first resonator 100 is electrically connected to the second electrode 13b of the second resonator 200 through the first trace 16, and the second electrode 13a of the first resonator 100, the second electrode 13b of the second resonator 200 and the first trace 16 have a one-piece structure.

Figure 16:
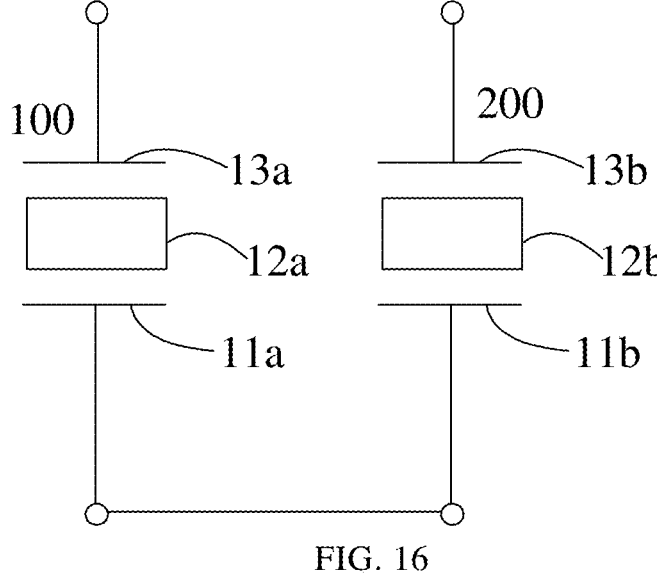
FIG. 16 is a circuit diagram of a filter in a third example of an embodiment of the present disclosure.
Figure 17:
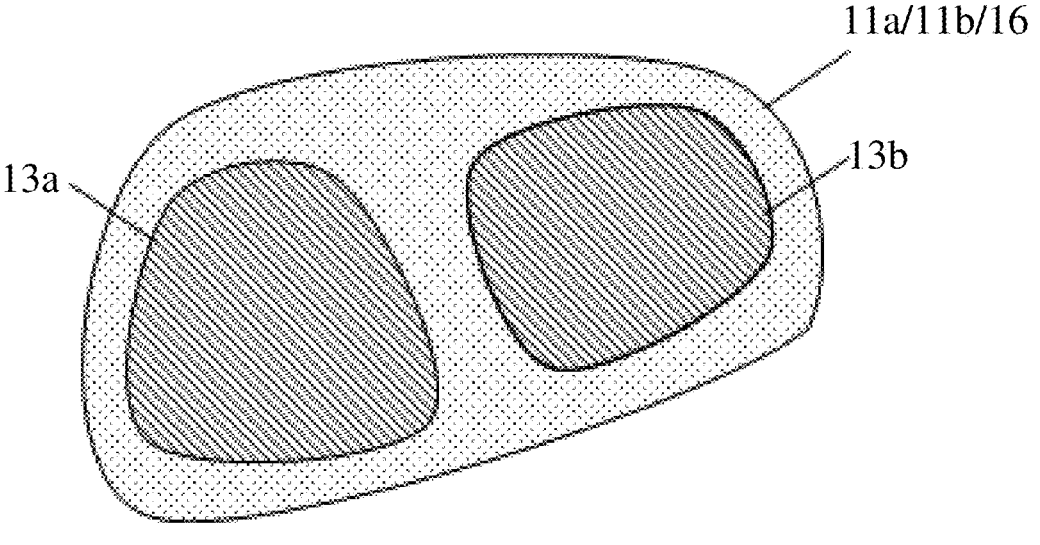
FIG. 17 is a top view of the filter shown in FIG. 16.
Figure 18:
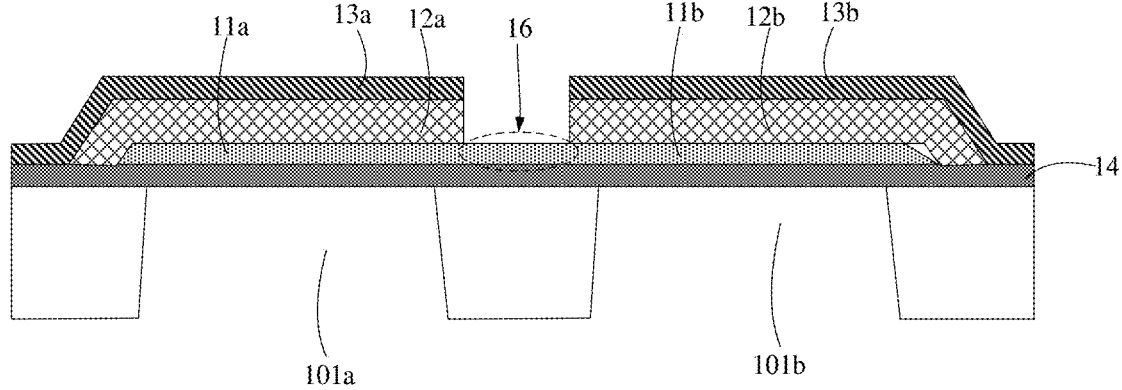
FIG. 18 is a cross-sectional view of the filter shown in FIG. 16.

In a third example: FIG. 16 is a circuit diagram of a filter in a third example of an embodiment of the present disclosure. FIG. 17 is a top view of the filter shown in FIG. 16. FIG. 18 is a cross-sectional view of the filter shown in FIG. 16. As shown in FIGS. 16 to 18, the filter includes a plurality of resonators connected in parallel. As an example, the filter includes two resonators connected in parallel. For convenience of description, the two resonators are referred to as a first resonator 100 and a second resonator 200, respectively. The dielectric substrate 10 of the first resonator 100 and the dielectric substrate 10 of the second resonator 200 are common. The first electrode 11a of the first resonator 100 is electrically connected to the first electrode 11b of the second resonator 200 through a first trace 16, thereby realizing the parallel connection of the first resonator 100 and the second resonator 200.

For the specific structure of layers of the filter shown in FIG. 16, as shown in FIG. 18, the dielectric substrate 10 has a first cavity 101a of the first resonator 100 and a first cavity 101b of the second resonator 200, the supporting layer 14 is disposed on the first surface of the dielectric substrate 10, a first electrode 11a of the first resonator 100 and a first electrode 11b of the second resonator 200 are disposed on a side of the supporting layer 14 away from the first surface, and are electrically connected to each other through a first trace 16, and the first electrode 11a of the first resonator 100, the first electrode 11b of the second resonator 200 and the first trace 16 have a one-piece structure. The first electrode of the first resonator 100 covers the first opening of the first cavity of the first resonator 100, and the first electrode 11b of the second resonator 200 covers the first opening of the first cavity 101b of the second resonator 200; a piezoelectric layer 12a of the first resonator 100 is located on a side of the first electrode 11a of the first resonator 100 away from the supporting layer 14, a piezoelectric layer 12b of the second resonator 200 is located on a side of the first electrode 11b of the second resonator 200 away from the supporting layer 14, and the piezoelectric layer 12a of the first resonator 100 and the piezoelectric layer 12b of the second resonator 200 are arranged in the same layer; the second electrode 13a of the first resonator 100 is located on a side of the piezoelectric layer 12a of the first resonator 100 away from the first electrode 11a, the second electrode 13b of the second resonator 200 is located on a side of the piezoelectric layer 12b of the second resonator 200 away from the first electrode 11b, the second electrode 13a of the first resonator 100 is electrically connected to the second electrode 13b of the second resonator 200 are arranged in the same layer.

Figure 19:
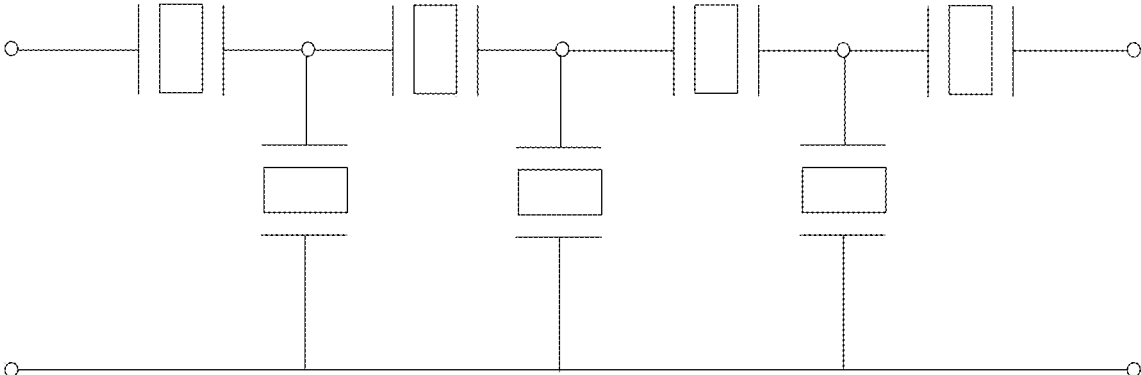
FIG. 19 is a circuit diagram of a filter in a fourth example of an embodiment of the present disclosure.

In a fourth example: FIG. 19 is a circuit diagram of a filter in a fourth example of an embodiment of the present disclosure. As shown in FIG. 19, the filter includes a plurality of resonators, which are partially connected in series and partially connected in parallel, thereby realizing the electric connection of the plurality of resonators. The relationship of the layers of the resonators in the filter may be provided as above, and thus, the details are not repeated herein.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A bulk acoustic wave resonator, comprising a dielectric substrate, a first electrode, a piezoelectric layer, and a second electrode; wherein the dielectric substrate comprises a first surface and a second surface opposite to each other in a thickness direction of the dielectric substrate, the first electrode is on a side of the first surface away from the second surface, the piezoelectric layer is on a side of the first electrode away from the dielectric substrate, and the second electrode is on a side of the piezoelectric layer away from the first electrode; wherein the dielectric substrate has a first cavity penetrating through the dielectric substrate in the thickness direction of the dielectric substrate, and the first cavity comprises a first opening penetrating through the first surface, and a second opening penetrating through the second surface;

the first opening comprises a plurality of first sides sequentially arranged in a clockwise direction, and a plurality of first connecting sides, each of which connects two adjacent first sides; the second opening comprises a plurality of second sides sequentially arranged in a clockwise direction, and a plurality of second connecting sides, each of which connects two adjacent second sides; the plurality of first sides are in one-to-one correspondence with the plurality of second sides, and the plurality of first connecting sides are in one-to-one correspondence with the plurality of second connecting sides;

for any two adjacent first sides and the first connecting side connecting the two adjacent first sides, a tangent line at any point on one first side intersects with a tangent line at any point on the other first side at a first intersection point, and the first intersection point is on a side of the first connecting side close to the second connecting side corresponding to the first connecting side; and for any two adjacent second sides and the second connecting side connecting the two adjacent second sides, a tangent line at any point on one second side intersects with a tangent line at any point on the other second side at a second intersection point, and the second intersection point is on a side of the second connecting side away from the first connecting side corresponding to the second connecting side.

2. The bulk acoustic wave resonator according to claim 1, wherein the first cavity comprises a plurality of first side surfaces sequentially arranged in a clockwise direction and a plurality of first connecting surfaces, each of which connects two adjacent first side surfaces; and an angle between a tangent plane at any point on each first side surface and a plane of the second surface is in a range from 80° to 88°.

3. The bulk acoustic wave resonator according to claim 2, wherein each first connecting surface is an arc surface.

4. The bulk acoustic wave resonator according to claim 1, wherein each first connecting side is an arc segment.

5. The bulk acoustic wave resonator according to claim 4, wherein a curvature radius of each first connecting side is in a range from 5 μm to 50 μm.

6. The bulk acoustic wave resonator according to claim 1, wherein each second connecting side is an arc segment.

7. The bulk acoustic wave resonator according to claim 6, wherein a curvature radius of each first connecting side is in a range from 5 μm to 50 μm.

8. The bulk acoustic wave resonator according to claim 1, wherein each first connecting side is a straight line segment or an arc segment.

9. The bulk acoustic wave resonator according to claim 1, wherein each second connecting side is an arc segment.

10. The bulk acoustic wave resonator according to claim 1, further comprising a supporting layer between the first surface and the first electrode.

11. A method for manufacturing a bulk acoustic wave resonator, wherein the method comprises:

providing a dielectric substrate, wherein the dielectric substrate comprises a first surface and a second surface which are oppositely disposed in a thickness direction of the dielectric substrate;

sequentially forming a first electrode, a piezoelectric layer and a second electrode on the first surface of the dielectric substrate; and etching the dielectric substrate to form a first cavity penetrating through the dielectric substrate in the thickness direction of the dielectric substrate; wherein the first cavity comprises a first opening penetrating through the first surface, and a second opening penetrating through the second surface;

wherein the first opening comprises a plurality of first sides sequentially arranged in a clockwise direction, and a plurality of first connecting sides, each of which connects two adjacent first sides; the second opening comprises a plurality of second sides sequentially arranged in a clockwise direction, and a plurality of second connecting sides, each of which connects two adjacent second sides; the plurality of first sides are in one-to-one correspondence with the plurality of second sides, and the plurality of first connecting sides are in one-to-one correspondence with the plurality of second connecting sides;

for any two adjacent first sides and the first connecting side connecting the two adjacent first sides, a tangent line at any point on one first side intersects with a tangent line at any point on the other first side at a first intersection point, and the first intersection point is on a side of the first connecting side close to the second connecting side corresponding to the first connecting side; and for any two adjacent second sides and the second connecting side connecting the two adjacent second sides, a tangent line at any point on one second side intersects with a tangent line at any point on the other second side at a second intersection point, and the second intersection point is on a side of the second connecting side away from the first connecting side corresponding to the second connecting side.

12. The method according to claim 11, wherein the etching the dielectric substrate to form the first cavity penetrating through the dielectric substrate in the thickness direction of the dielectric substrate comprises:

forming the first cavity penetrating through the dielectric substrate in the thickness direction of the dielectric substrate by performing a laser-induced etching process on the second surface of the dielectric substrate.

13. The method according to claim 12, wherein an etching solution used in the laser-induced etching process is hydrofluoric acid or sodium hydroxide.

14. The method according to claim 11, wherein the first cavity comprises a plurality of first side surfaces sequentially arranged in a clockwise direction and a plurality of first connecting surfaces, each of which connects two adjacent first side surfaces; and an angle between a tangent plane at any point on each first side surface and a plane of the second surface is in a range from 80° to 88°.

15. The method according to claim 14, wherein each first connecting surface is an arc surface.

16. The method according to claim 11, wherein each first connecting side is an arc segment.

17. The method according to claim 16, wherein a curvature radius of each first connecting side is in a range from 5 $\mu$m to 50 $\mu$m.

18. The method according to claim 11, wherein each second connecting side is an arc segment.

19. The method according to claim 18, wherein a curvature radius of each first connecting side is in a range from 5 $\mu$m to 50 $\mu$m.

20. A filter, comprising a plurality of bulk acoustic wave resonators, which comprise a first bulk acoustic wave resonator and a second bulk acoustic wave resonator, and/or a third bulk acoustic wave resonator and a fourth bulk acoustic wave resonator, wherein each of the first bulk acoustic wave resonator, the second bulk acoustic resonator, the third bulk acoustic wave resonator and the fourth bulk acoustic wave resonator is the bulk acoustic wave resonator according to claim 1; and the dielectric substrate of the first bulk acoustic resonator and the dielectric substrate of the second bulk acoustic resonator are common, the second electrode of the first bulk acoustic resonator is electrically connected to the first electrode of the second bulk acoustic resonator through a first trace, thereby realizing a series connection of the first bulk acoustic resonator and the second bulk acoustic resonator; and the dielectric substrate of the third bulk acoustic resonator and the dielectric substrate of the fourth bulk acoustic resonator are common, the second electrode of the third bulk acoustic resonator is electrically connected to the second electrode of the fourth bulk acoustic resonator through a second trace, thereby realizing a parallel connection of the third bulk acoustic resonator and the fourth bulk acoustic resonator.

* * * * *